(12) United States Patent
Kang et al.

(10) Patent No.: US 6,243,268 B1
(45) Date of Patent: Jun. 5, 2001

(54) COOLED IC CHIP MODULES WITH AN INSULATED CIRCUIT BOARD

(75) Inventors: Sukhvinder Kang, Rochester, MN (US); Howard Victor Mahaney, Jr., Cedar Park, TX (US); Roger R. Schmidt; Prabjit Singh, both of Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/416,074

(22) Filed: Oct. 12, 1999

(51) Int. Cl.[7] ....................................................... H05K 7/20
(52) U.S. Cl. .......................... 361/715; 361/711; 361/717; 361/743; 174/16.3; 257/713; 165/104.21; 62/259.2
(58) Field of Search .................. 361/711–719, 687–699, 361/700–704, 743–760; 257/706–727; 174/15.1, 16.2, 16.3; 165/80.3, 80.4, 104.21, 104.24, 104.33; 219/200, 201, 209, 210; 62/52.1, 259.2, 272, 273, 156, 51.2

(56) References Cited

U.S. PATENT DOCUMENTS

| 5,028,988 | 7/1991 | Porter et al. | 357/81 |
| 5,142,443 | 8/1992 | Moore, Jr. | 361/385 |
| 5,268,812 | 12/1993 | Conte | 361/698 |
| 5,349,823 | 9/1994 | Solomon | 62/6 |
| 5,365,749 | 11/1994 | Porter | 62/259.2 |
| 5,463,872 | 11/1995 | Vader et al. | 62/51.1 |
| 5,504,924 | 4/1996 | Ohasji et al. | 375/800 |
| 5,574,627 | * 11/1996 | Porter | 361/719 |
| 6,054,676 | * 4/2000 | Wall et al. | 219/209 |
| 6,122,926 | * 9/2000 | Kang et al. | 62/259.2 |
| 6,125,036 | * 9/2000 | Kang et al. | 361/700 |

* cited by examiner

Primary Examiner—Leo P. Picard
Assistant Examiner—Michael Datskovsky
(74) Attorney, Agent, or Firm—Floyd Gonzalez; Cantor Colburn LLP

(57) ABSTRACT

A cooling assembly for an integrated circuit chip module wherein an evaporator-cooled IC module mounted on a printed circuit board is enclosed within an insulated housing, and the area of the printed circuit board adjacent the cooled IC module is encapsulated in an insulated jacket.

7 Claims, 2 Drawing Sheets

COOLED IC CHIP MODULES WITH AN INSULATED CIRCUIT BOARD

BACKGROUND OF THE INVENTION

The present invention relates to cooling technology for electronic packaging for computer systems, and, more particularly, relates to a cooling assembly for lowering the temperature of integrated circuit (IC) chip modules mounted on a printed circuit board (PCB) substrate and control of condensation resulting therefrom.

The high circuit densities and operating frequencies in modern integrated circuit devices and multi-chip modules of today's computer systems has resulted in a significant increase in the power dissipated by such chip and module components. No matter how fast one wishes to operate a given electronic circuit chip, there almost always is the potential for running it faster if the chip were to be cooled further and more thermal energy is removed during its operation. This is true of computer processor circuit chips and more particularly of such chips disposed within multi-chip modules that generate significant amounts of heat. Because of the demand to run processor modules at increasingly higher speeds, the clock frequencies at which the devices must operate also increases. Power generation correspondingly rises in proportion to the clock frequency, generating thermal demands in terms of energy which must be removed for faster, safer, and more reliable circuit operation. It is required that cooling arrangements be provided so that the heat generated by the operation of these components be effectively and efficiently removed in order to maintain the temperature of the devices within the limits that will keep the operating parameters of the devices in a predetermined range, and, further, to prevent the damage or destruction of the integrated circuit devices by overheating from the high temperatures generated.

Using refrigeration technology, integrated circuit chips and multi-chip modules readily can be cooled to appropriately low temperatures. In addition, however, to the necessity of cooling to prevent damage from overheating, it is also recognized that cooling offers marked advantages in circuit speed, system throughput, and component reliability. With the advent of CMOS processors for computers, the potential performance improvements obtained by lowering chip temperature are intriguing. It is known that a CMOS circuit is capable of operating at higher clock speeds as the circuit temperature is lowered. Current CMOS chip circuit designs generally perform about two percent faster for each 10° C. the chip temperature is lowered. Accordingly, it would not be unreasonable to achieve a 100° C. reduction in chip temperature with refrigeration techniques as compared to cooling with ambient air, thus achieving a 20% performance improvement. It has been reported that the processor frequency of a CMOS processor has been improved by nearly threefold by cooling the processor to temperatures around −200° C.

Various techniques for the cooling of integrated circuit electronic devices are known and many have been implemented with success. Some practiced techniques involve conventional methods such as by directing ambient air onto the components to be cooled; by sealing the computer cabinet and refrigerating the interior of the cabinet; as well as by immersing components in coolants such as liquid nitrogen. Individual integrated chip or multi-chip module components also have been cooled through specialized devices such as hollow cold plates which are attached to the components to be cooled. Liquid coolants can be circulated through the hollow cold plates to effect cooling of the attached components.

However, in order to take practical advantage of the performance improvements achievable by lowering integrated chip temperatures to levels, for example, in the range of −40° C. to −60° C., many engineering problems must be addressed. In addition to issues involving refrigeration system design, evaporator design, and thermal controls, cooling of the electronic components to a temperature below the ambient environment dew point results in condensation problems in that moisture will condense on the cooled components and on the structures and components to which the cooled components may be attached. This condensation can damage and literally destroy the electronic circuitry associated with the integrated chip or multi-chip module and the circuit board on which it is mounted.

Accordingly, a cooling system is needed for an integrated chip or multi-chip module device which effectively and efficiently can reduce the temperature of the device to below ambient dew point without causing condensation damage to the device or contiguous components or circuitry.

SUMMARY OF THE INVENTION

Now, an improved assembly for cooling an integrated circuit (IC) device mounted on a printed circuit board (PCB) within a computer system has been developed whereby cooling of the IC device is efficiently and effectively accomplished while damaging condensation is controlled from forming on the cooled devices as well as the PCB on which the IC device is mounted and other electrical components contiguous to the cooled device. According to the present invention, a cooling assembly is provided which comprises an evaporator unit attached to the top of the hat, or cover, of an integrated chip module and in thermal communication with the hat surface. In order to maintain the reduced temperature of the cooled device and isolate the device from the ambient warm environment, the IC module and attached cooling evaporator unit are housed within an insulated enclosure which fully envelops the device and evaporator and is itself bonded around its bottom peripheral edge to the surface of the printed circuit board around the outer perimeter of the module to board interface. The enclosure includes walls fabricated from thermal insulating material. Such material comprises rigid structural foam such as polyurethane foam, expanded polystyrene, and the like, in order to provide structural integrity as well as a thermal insulative barrier. Typically, such structural foams feature thermal conductivities ranging from about 0.04 to about 0.12 W/m.° K. The preferred insulating material is rigid polyurethane foam. While it is critical to cool the IC module to low temperatures, typically in the range of about −40° C. to about −60° C., cooling to such temperatures below ambient dew point presents potential condensation problems on the cooled component as well as structures and other components attached to and around the cooled component. The described insulation helps to isolate the cooled module from the surrounding environment, but, at the low temperatures to which the module is cooled, the insulated enclosure itself may get cool enough to result in condensation on its outer surface, as well as on the printed circuit board to which it is attached. Accordingly, in order to raise the temperature of the printed circuit board immediate to the area of the cooled IC module to a level above the dew point, the present invention provides for heat to be applied to the PCB in those areas. While the use of independent heating elements, such as thin foil heaters powered by DC voltages, previously has been practiced to raise the temperature in select locations on the PCB to prevent condensation, the present invention utilizes heat generated by components already present on the printed circuit board in the area of the cooled module. To accomplish this, an insulated jacket is positioned to encapsulate the PCB, preferably the top side and bottom side of the PCB, and components mounted thereon, in the area of the PCB surrounding a refrigerated IC module. The insulated jacket preferably extends to encompass the bottom side of the PCB in the area of the PCB to which the refrigerated module is attached. The jacket may be made from such materials as are used for the insulated module enclosure. The low level heat generated by the encapsulated components serves to prevent condensation from forming in the areas adjacent the refrigerated module on the PCB. However, in addition to prevention of condensation, encapsulation of the PCB also may serve to enhance the performance of the enclosed components. For example, cooling of adjacent SRAM chips on the PCB may increase the overall performance of the SRAM and even reduce the need for as much SRAM required by the system. Eliminating SRAM would reduce overall system cost. By encapsulating the PCB in an insulated jacket, the cooling provided to the refrigerated module is now conducted through the module, down to the PCB on which it is mounted, and then laterally through the adjacent PCB area. The cooling conducted through the PCB results in lowering the temperature of the SRAM chips mounted on the PCB in that area. To improve conduction from the evaporator of the refrigerated module down to the PCB and then laterally through the card, it is preferred to enhance the conduction paths involved. Such enhancements might include using a high conductivity substrate material in the module assembly, high conductivity interconnects, high conductivity module hat material, high conductivity clamping mechanism for attaching the module to the PCB, high conductivity printed circuit boards (e.g., with copper planes), and the like.

BRIEF DESCRIPTION OF THE DRAWINGS

Referring now to the drawings in which like elements are numbered above in the several Figures.

DETAILED DESCRIPTION OF THE INVENTION

Figure 1:
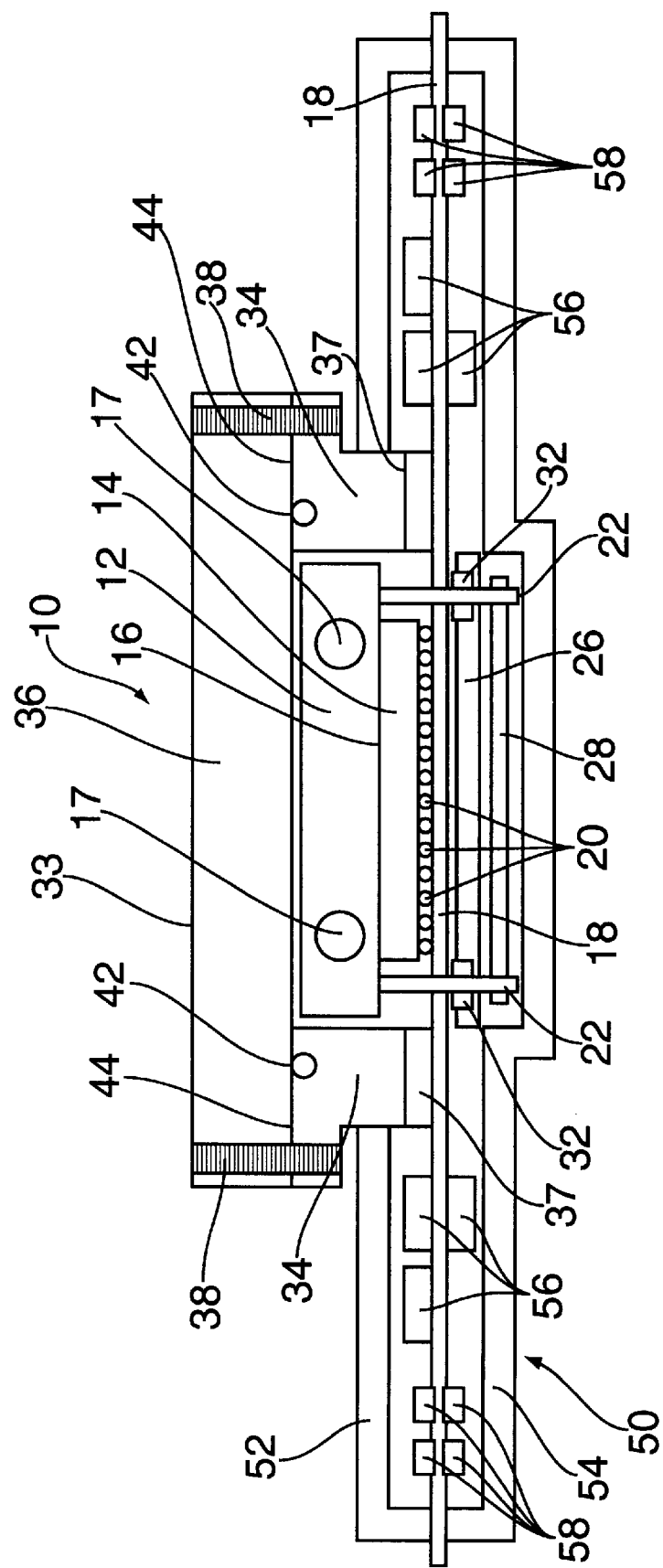
FIG. 1 is a cross-sectional side view illustrating an evaporator-cooled IC module mounted on a printed circuit board featuring encapsulation of the area of the PCB adjacent the mounted module.

Referring to FIG. 1, a cooling assembly 10 is shown comprising an evaporator unit 12, which is a thermal block of aluminum or copper, mounted on top of the hat, or cover, of an integrated circuit chip module 14, forming a thermal interface through conductive grease layer 16. In operation, coolant fluid from a refrigeration unit (not shown) is circulated through serpentine passages 17, bored or drilled into evaporator block 12, in a predetermined pattern. IC module 14 is in electrical communication with printed circuit board 18 via solder ball interconnects 20. The evaporator unit 12 is attached to the printed circuit board 18 by bolts 22, around its periphery, which extend from evaporator 12 and pass through printed circuit board 18 and are threaded into stiffener member 26, which serves to reinforce and stiffen the printed circuit board 18 to prevent it from flexing under the stress of the mounted cooling assembly 10, and finally threaded into steel spring plate 28. Rubber O-rings 32 seal around the mounting bolts and help to prevent air leakage into the assembly. In order to insulate the IC module 14 from the warm ambient surroundings, the evaporator-cooled module 14 is fully enclosed within an insulated housing 33 comprising a base member 34 and lid 36. Base 34 is made of a rigid polyurethane foam material, which preferably is formed by being molded to the appropriate shape. The bottom of enclosure base member 34 is bonded to the surface of the printed circuit board 18 through a compliant adhesive layer 37. The lid 36, which is separate and removable from base 34 in order to provide service access to IC module 14, also is made from a rigid polyurethane foam and is attached to the base by threaded connectors 38. To ensure an airtight seal between the lid 36 and base 34, an O-ring 42 is set around the interface of the lid 36 and base 34, along with a layer of grease 44.

Cooling of the IC module to typical temperatures in the range of −40 to −60° C. readily could introduce condensation problems on the outer surface of the insulated housing, as well as other structures and electrical components which are nearby or to which the IC module is attached. Accordingly, while it is desirable to maintain the module 14 inside of enclosure 33 as cold as possible, the outside surface of the enclosure and the adjacent PCB and other components thereon should be maintained warm, above ambient environment dew point. The area of the printed circuit board 18 surrounding the area where module 14 and insulated housing 33 are attached to the printed circuit board 18 is encapsulated by insulated jacket 50 comprising upper member 52 and lower member 54. The peripheral edges of the insulated jacket 50 are bonded to the upper and lower surfaces of the PCB through an adhesive layer (not shown). In this manner, the area of the PCB adjacent the refrigerated module 14 is encapsulated, along with SRAM chips 56 and capacitors 58 which are attached to the PCB in this adjacent area. Insulated jacket 50 is fabricated by molding solid polyurethane foam. By encapsulation of the PCB, the cooling provided to refrigerated module 14 is conducted through the module down to the PCB and then laterally through the adjacent PCB area. This serves to cool the components (e.g., SRAM) attached to the PCB in these adjacent areas, so as to enhance their performance. At the same time, the low level of heat generated by the encapsulated components will be held within the insulated jacket and prevent condensation from forming on the PCB and components in this enclosed area.

Figure 2:
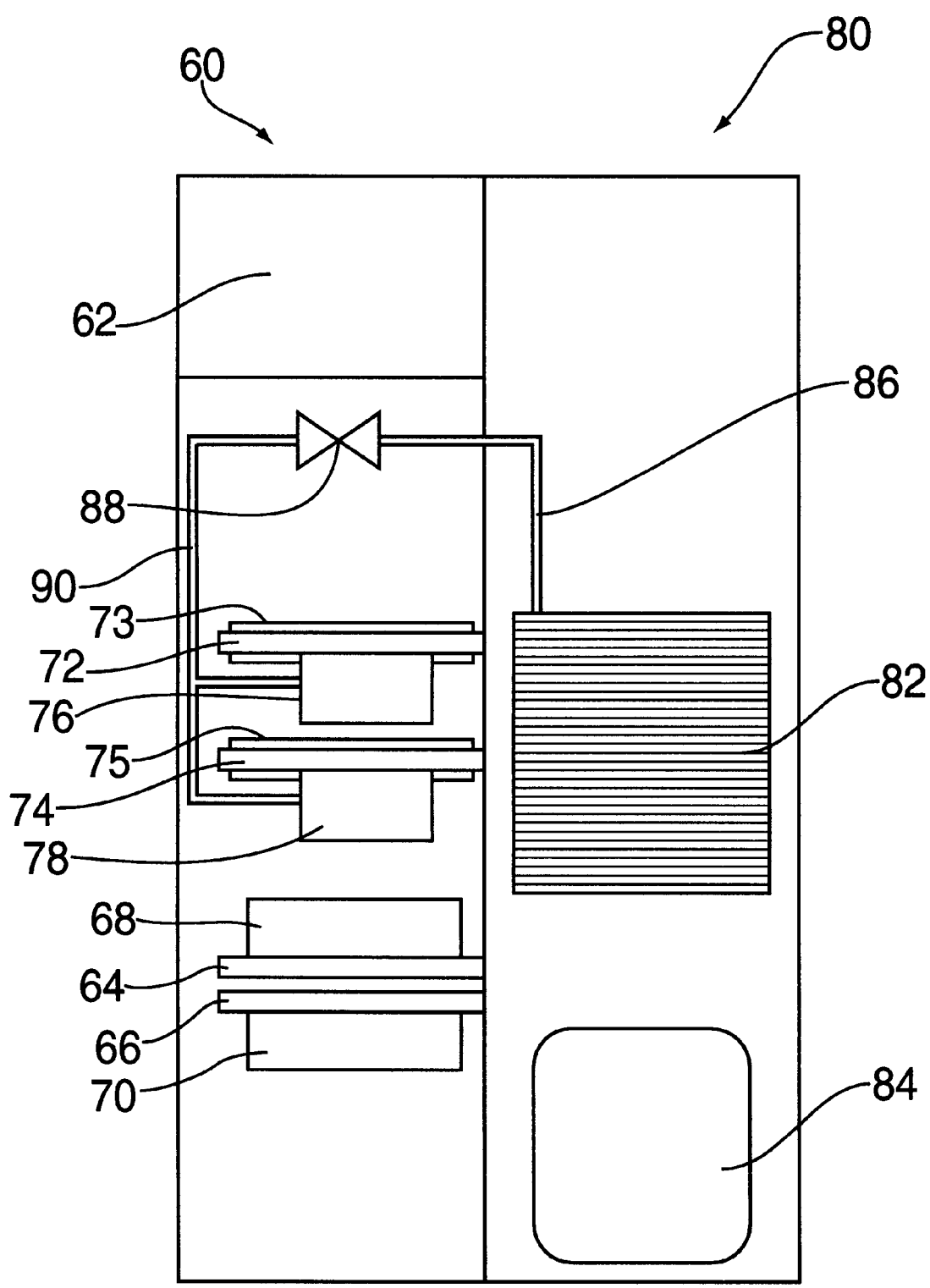
FIG. 2 is a simplified front view of depicting the arrangement of components in a typical workstation processor unit with a sidecar refrigeration system.

FIG. 2 is a simplified front view showing the arrangement of components in a typical computer workstation processor unit 60 wherein one or more integrated circuit chip modules is cooled through a refrigerated evaporator unit. The processor unit 60 consists of a power supply 62, memory cards 64 and 66, to which component modules 68 and 70 are mounted, and processor cards PCB 72 and 74, to which evaporator cooled processor integrated chip modules enclosed within insulated housings 76 and 78 are mounted. PCB cards 72 and 76 are encapsulated by insulated jackets 73 and 75 respectively. Mated next to the processor unit 60 is sidecar refrigeration unit 80 which provides cooling for processor unit 60. Refrigeration unit 80 consists of condenser 82 and compressor 84, interconnected with appropriate hosing and conduits (not shown) and connected through flexible refrigerant line 86 with quick connect coupling 88 to refrigerant distribution hose 90. Distribution hose 90 conducts coolant to the evaporator blocks within insulated housings 76 and 78 to cool the enclosed IC modules.

While the invention has been described with reference to specific embodiments thereof, it is intended that all matter contained in the above description and shown in the accompanying drawings be interpreted as illustrative and not limiting in nature. Various modifications of the disclosed embodiments, as well as other embodiments of the invention, will be apparent to those skilled in the art upon reference to this description, or may be made without departing from the spirit and scope of the invention as defined in the amended claims.

We claim:

1. A cooling assembly for an integrated circuit chip module mounted on a printed circuit board substrate comprising:

an evaporator unit having a thermal interface in thermal communication with said integrated circuit chip module so as to cool said module to a temperature below ambient dew point;

an insulated housing having its base attached to said printed circuit board substrate and surrounding the outer perimeter of said integrated circuit module so as to enclose said evaporator unit and said integrated circuit module; and, an insulated jacket encapsulating an area of the printed circuit board adjacent the area where the insulated housing is attached to the printed circuit board, said insulated jacket further encapsulating both the top side and bottom side of the printed circuit board.

2. The cooling assembly of claim 1 wherein the insulated jacket extends from the area of the printed circuit board adjacent to the area where the insulated housing is attached to the printed circuit board to include the area on the bottom side of the printed circuit board where the module is mounted on the printed circuit board.

3. The cooling assembly of claim 2 wherein the area of the printed circuit board encapsulated by the insulated jacket is in flow communication with the area of the printed circuit board where the module is mounted on the printed circuit board.

4. The cooling assembly of claim 1 wherein electronic devices mounted on the printed circuit board are encapsulated within the insulated jacket.

5. The cooling assembly of claim 5 wherein said electronic devices include SRAM chips mounted on the printed circuit board.

6. The cooling assembly of claim 3 wherein the insulated jacket extends to encapsulate all of the electronic devices mounted on the printed circuit board.

7. The cooling assembly of claim 1 wherein the insulated jacket is fabricated from thermal insulating material selected from the group consisting of polyurethane foam and expanded polystyrene.

* * * * *